(12) United States Patent
Weston-Lewis et al.

(10) Patent No.: US 8,909,982 B2
(45) Date of Patent: Dec. 9, 2014

(54) SYSTEM AND METHOD FOR DETECTING COPYBACK PROGRAMMING PROBLEMS

(75) Inventors: Graeme Moffat Weston-Lewis, Fremont, CA (US); Douglas Alan Prins, Laguna Hills, CA (US); Aaron Keith Olbrich, Morgan Hill, CA (US)

(73) Assignee: SanDisk Enterprise IP LLC, Milpitas, CA (US)

( * ) Notice: Subject to any disclaimer, the term of this patent is extended or adjusted under 35 U.S.C. 154(b) by 241 days.

(21) Appl. No.: 13/285,892

(22) Filed: Oct. 31, 2011

(65) Prior Publication Data

US 2012/0324277 A1     Dec. 20, 2012

Related U.S. Application Data

(60) Provisional application No. 61/498,583, filed on Jun. 19, 2011.

(51) Int. Cl.
*G06F 11/00* (2006.01)
*G06F 11/10* (2006.01)
*G11C 16/10* (2006.01)
*G11C 11/56* (2006.01)
*G11C 16/34* (2006.01)

(52) U.S. Cl.
CPC ............ *G06F 11/1068* (2013.01); *G11C 16/10* (2013.01); *G11C 11/5628* (2013.01); *G11C 16/105* (2013.01); *G11C 16/3418* (2013.01)
USPC .......................................................... 714/6.1

(58) Field of Classification Search
USPC .......................................................... 711/103
See application file for complete search history.

(56) References Cited

U.S. PATENT DOCUMENTS

| | | | |
|---|---|---|---|
| 4,916,652 | A | 4/1990 | Schwarz et al. |
| 5,519,847 | A | 5/1996 | Fandrich et al. |
| 5,530,705 | A | 6/1996 | Malone, Sr. |
| 5,537,555 | A | 7/1996 | Landry et al. |
| 5,551,003 | A | 8/1996 | Mattson et al. |
| 5,657,332 | A | 8/1997 | Auclair et al. |

(Continued)

FOREIGN PATENT DOCUMENTS

| | | |
|---|---|---|
| EP | 1465203 A1 | 10/2004 |
| EP | 1 990 921 A2 | 11/2008 |

(Continued)

OTHER PUBLICATIONS

SanDisk Enterprise, ISR/WO, PCT/US2012/042764, Aug. 31, 2012, 12 pgs.

(Continued)

*Primary Examiner* — Michael Maskulinski
(74) *Attorney, Agent, or Firm* — Morgan, Lewis & Bockius LLP (57) ABSTRACT

Methods and systems are disclosed herein for detecting problems related to copyback programming. After the copyback data is read into the internal flash buffer, a part of the copyback data stored in the internal flash buffer (such as spare data) is analyzed to determine whether there are any errors in a part of the copyback data read. The analysis may be used by the flash memory in one or more ways related to the current copyback operation, subsequent copyback operations, subsequent treatment of the data in the current copyback operation, and subsequent treatment of the section in memory associated with the source page.

12 Claims, 6 Drawing Sheets

(56) References Cited

U.S. PATENT DOCUMENTS

| | | | |
|---|---|---|---|
| 5,666,114 A | 9/1997 | Brodie et al. | |
| 5,708,849 A | 1/1998 | Coke et al. | |
| 5,943,692 A | 8/1999 | Marberg et al. | |
| 5,982,664 A | 11/1999 | Watanabe | |
| 6,000,006 A | 12/1999 | Bruce et al. | |
| 6,016,560 A | 1/2000 | Wada et al. | |
| 6,018,304 A | 1/2000 | Bessios | |
| 6,070,074 A | 5/2000 | Perahia et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh | |
| 6,311,263 B1 | 10/2001 | Barlow et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,895,464 B2 | 5/2005 | Chow et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,032,123 B2 | 4/2006 | Kane et al. | |
| 7,043,505 B1 | 5/2006 | Teague et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,596,643 B2 | 9/2009 | Merry, Jr. et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich et al. | |
| 7,996,642 B1 | 8/2011 | Smith | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,254,181 B2 | 8/2012 | Hwang et al. | |
| 8,312,349 B2 * | 11/2012 | Reche et al. | 714/773 |
| 8,412,985 B1 * | 4/2013 | Bowers et al. | 714/42 |
| 2002/0024846 A1 | 2/2002 | Kawahara et al. | |
| 2002/0083299 A1 | 6/2002 | Van Huben et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid et al. | |
| 2003/0088805 A1 | 5/2003 | Majni et al. | |
| 2003/0093628 A1 | 5/2003 | Matter et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 | 3/2005 | Shrader et al. | |
| 2005/0114587 A1 | 5/2005 | Chou et al. | |
| 2005/0172065 A1 | 8/2005 | Keays | |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0231765 A1 | 10/2005 | So et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0053246 A1 | 3/2006 | Lee | |
| 2006/0085671 A1 | 4/2006 | Majni et al. | |
| 2006/0136570 A1 | 6/2006 | Pandya | |
| 2006/0156177 A1 | 7/2006 | Kottapalli et al. | |
| 2006/0195650 A1 | 8/2006 | Su et al. | |
| 2006/0259528 A1 | 11/2006 | Dussud et al. | |
| 2007/0011413 A1 | 1/2007 | Nonaka et al. | |
| 2007/0058446 A1 | 3/2007 | Hwang et al. | |
| 2007/0061597 A1 | 3/2007 | Holtzman et al. | |
| 2007/0076479 A1 | 4/2007 | Kim et al. | |
| 2007/0081408 A1 | 4/2007 | Kwon et al. | |
| 2007/0083697 A1 | 4/2007 | Birrell et al. | |
| 2007/0113019 A1 | 5/2007 | Beukema et al. | |
| 2007/0133312 A1 | 6/2007 | Roohparvar | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujibayashi et al. | |
| 2007/0208901 A1 | 9/2007 | Purcell et al. | |
| 2007/0234143 A1 | 10/2007 | Kim | |
| 2007/0245061 A1 | 10/2007 | Harriman | |
| 2007/0277036 A1 | 11/2007 | Chamberlain et al. | |
| 2007/0291556 A1 | 12/2007 | Kamei | |
| 2007/0294496 A1 | 12/2007 | Goss et al. | |
| 2007/0300130 A1 | 12/2007 | Gorobets | |
| 2008/0019182 A1 | 1/2008 | Yanagidaira et al. | |
| 2008/0022163 A1 | 1/2008 | Tanaka et al. | |
| 2008/0052446 A1 | 2/2008 | Lasser et al. | |
| 2008/0077841 A1 | 3/2008 | Gonzalez et al. | |
| 2008/0077937 A1 | 3/2008 | Shin et al. | |
| 2008/0086677 A1 | 4/2008 | Yang et al. | |
| 2008/0144371 A1 | 6/2008 | Yeh et al. | |
| 2008/0147964 A1 | 6/2008 | Chow et al. | |
| 2008/0147998 A1 * | 6/2008 | Jeong | 711/161 |
| 2008/0148124 A1 | 6/2008 | Zhang et al. | |
| 2008/0163030 A1 | 7/2008 | Lee | |
| 2008/0168191 A1 | 7/2008 | Biran et al. | |
| 2008/0168319 A1 | 7/2008 | Lee et al. | |
| 2008/0170460 A1 | 7/2008 | Oh et al. | |
| 2008/0229000 A1 * | 9/2008 | Kim | 711/103 |
| 2008/0229003 A1 | 9/2008 | Mizushima et al. | |
| 2008/0229176 A1 | 9/2008 | Arnez et al. | |
| 2008/0270680 A1 | 10/2008 | Chang | |
| 2008/0282128 A1 | 11/2008 | Lee et al. | |
| 2008/0285351 A1 | 11/2008 | Shlick et al. | |
| 2009/0003058 A1 | 1/2009 | Kang | |
| 2009/0037652 A1 | 2/2009 | Yu et al. | |
| 2009/0144598 A1 | 6/2009 | Yoon et al. | |
| 2009/0168525 A1 | 7/2009 | Olbrich et al. | |
| 2009/0172258 A1 | 7/2009 | Olbrich et al. | |
| 2009/0172259 A1 | 7/2009 | Prins et al. | |
| 2009/0172260 A1 | 7/2009 | Olbrich et al. | |

(56) References Cited

U.S. PATENT DOCUMENTS

| | | | |
|---|---|---|---|
| 2009/0172261 A1 | 7/2009 | Prins et al. | |
| 2009/0172262 A1 | 7/2009 | Olbrich et al. | |
| 2009/0172308 A1 | 7/2009 | Prins et al. | |
| 2009/0172335 A1 | 7/2009 | Kulkarni et al. | |
| 2009/0172499 A1 | 7/2009 | Olbrich et al. | |
| 2009/0193058 A1 | 7/2009 | Reid | |
| 2009/0207660 A1 | 8/2009 | Hwang et al. | |
| 2009/0222708 A1 | 9/2009 | Yamaga | |
| 2009/0228761 A1 | 9/2009 | Perlmutter et al. | |
| 2009/0296466 A1 | 12/2009 | Kim et al. | |
| 2009/0296486 A1 | 12/2009 | Kim et al. | |
| 2009/0319864 A1 | 12/2009 | Shrader | |
| 2010/0061151 A1 | 3/2010 | Miwa et al. | |
| 2010/0103737 A1 | 4/2010 | Park | |
| 2010/0161936 A1 | 6/2010 | Royer et al. | |
| 2010/0199125 A1 | 8/2010 | Reche | |
| 2010/0202196 A1 | 8/2010 | Lee et al. | |
| 2010/0208521 A1* | 8/2010 | Kim et al. | 365/185.09 |
| 2010/0262889 A1 | 10/2010 | Bains | |
| 2010/0281207 A1 | 11/2010 | Miller et al. | |
| 2010/0281342 A1* | 11/2010 | Chang et al. | 714/773 |
| 2011/0083060 A1 | 4/2011 | Sakurada et al. | |
| 2011/0113281 A1* | 5/2011 | Zhang et al. | 714/6.12 |
| 2011/0131444 A1 | 6/2011 | Buch et al. | |
| 2011/0173378 A1 | 7/2011 | Filor et al. | |
| 2011/0205823 A1 | 8/2011 | Hemink et al. | |
| 2011/0213920 A1 | 9/2011 | Frost et al. | |
| 2011/0228601 A1 | 9/2011 | Olbrich et al. | |
| 2011/0231600 A1 | 9/2011 | Tanaka et al. | |
| 2012/0096217 A1 | 4/2012 | Son et al. | |
| 2012/0110250 A1* | 5/2012 | Sabbag et al. | 711/103 |
| 2012/0151253 A1 | 6/2012 | Horn | |
| 2012/0195126 A1 | 8/2012 | Roohparvar | |
| 2012/0239976 A1 | 9/2012 | Cometti et al. | |
| 2012/0284587 A1 | 11/2012 | Yu et al. | |

FOREIGN PATENT DOCUMENTS

| | | |
|---|---|---|
| JP | 2002-532806 | 10/2002 |
| WO | WO 2007/036834 A2 | 4/2007 |
| WO | WO 2007/080586 A2 | 7/2007 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |

OTHER PUBLICATIONS

SanDisk Enterprise, Office Action, Japanese Patent Application No. 2010-540863, Jul. 24, 2012, 3 pgs.
Sandisk Enterprise, ISR/WO, PCT/US2012/059459, Feb. 14, 2013, 9 pgs.
SanDisk Enterprise, Office Action, CN 200880127623.8, Dec. 31, 2012, 9 pgs.
Sandisk Enterprise IP LLC, ISR/WO, PCT/US2012/042771, Mar. 4, 2013, 14 pgs.
Kang, A Multi-Channel Architecture for High-Performance NAND Flash-Based Storage System, J. Syst. Archit., 53, 9, Sep. 2007, 15 pgs.
Watchdog Timer and Power Savin Modes, Microchip Technology Inc., 2005 14 pgs.
SanDisk Enterprise IP LLC, Office Action, Chinese Patent Application 200880127623.8, Apr. 18, 2012, 20 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise, ISR/WO, PCT/US2012/042775, Sep. 26, 2012, 8 pgs.
Barr, Introduction to Watchdog Timers, Oct. 2001, 3 pgs.
Kim, A Space-Efficient Flash Translation Layer for CompactFlash Systems, IEEE Transactions on Consumer Electronics, vol. 48, No. 2, May 2002, pp. 366-375.
McLean, Information Technology—AT Attachment with Packet Interface Extension, Aug. 19, 1998, 339 pgs.
Park, A High Performance Controller for NAND Flash-based Solid State Disk (NSSD), Feb. 12-16, 2006, 4 pgs.
Pliant Technology, Inc., International Search Report and Written Opinion, PCT/US08/88133, Mar. 19, 2009, 7 pgs.
Pliant Technology, Inc., International Search Report and Written Opinion, PCT/US08/88136, Mar. 19, 2009, 7 pgs.
Pliant Technology, Inc., International Search Report and Written Opinion, PCT/US08/88146, Feb. 26, 2009, 10 pgs.
Pliant Technology, Inc., International Search Report and Written Opinion, PCT/US08/88154, Feb. 27, 2009, 8 pgs.
Pliant Technology, Inc., International Search Report and Written Opinion, PCT/US08/88164, Feb. 13, 2009, 8 pgs.
Pliant Technology, Inc., International Search Report and Written Opinion, PCT/US08/88206, Feb. 18, 2009, 7 pgs.
Pliant Technology, Inc., International Search Report and Written Opinion, PCT/US08/88217, Feb. 19, 2009, 7 pgs.
Pliant Technology, Inc., International Search Report and Written Opinion, PCT/US08/88229, Feb. 13, 2009, 7 pgs.
Pliant Technology, Inc. , International Search Report and Written Opinion, PCT/US08/88232, Feb. 19, 2009, 8 pgs.
Pliant Technology, Inc. , International Search Report and Written Opinion, PCT/US08/88236, Feb. 19, 2009, 7 pgs.
Pliant Technology, Inc., International Search Report and Written Opinion, PCT/US2011/028637, Oct. 27, 2011, 11 pgs.
Pliant Technology, Inc., Supplementary European Search Report, 08866997.3, Feb. 23, 2012, 6 pgs.
Zeidman, Verilog Designer's Library, 1999, 9 pgs.
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated May 14, 2014, received in International Patent Application No. PCT/US2014/017168, which corresponds to U.S. Appl. No. 14/076,115, 6 pages (Fitzpatrick).
International Search Report and Written Opinion dated May 14, 2014, received in International Patent Application No. PCT/US2014/017169, which corresponds to U.S. Appl. No. 14/076,148, 6 pages (Fitzpatrick).

* cited by examiner

SYSTEM AND METHOD FOR DETECTING COPYBACK PROGRAMMING PROBLEMS

REFERENCE TO RELATED APPLICATION

This application claims the benefit of U.S. Provisional Application No. 61/498,583, filed Jun. 19, 2011, the entirety of U.S. Provisional Application No. 61/498,583 is hereby incorporated by reference herein.

TECHNICAL FIELD

This application relates generally to managing data in a memory device. More specifically, this application relates to a flash memory implementing an improved programming sequence for detecting copyback programming problems.

BACKGROUND

Copyback is an operation used to read and copy data stored in one page (a source page) and reprogram it in another page (a destination page) in a flash memory. Unlike standard read and program operations, data retrieved from the source page is not streamed out (such as streamed out of the flash memory chip), but is saved in an internal buffer in the flash memory and then programmed directly into the destination page without using an external memory. In this way, the data is kept entirely within the flash memory chip and not sent to any external chip within the flash memory (such as to an external controller in the flash memory). Thus, the copyback operation is faster and more efficient than standard operations because reading out the data and then re-loading the data to be programmed are not required. The operation is particularly useful when a portion of a page is updated and the rest of the page needs to be copied to a newly assigned block.

Copyback operations are "blind" in that the data is moved without being checked. In particular, as the data read from the source page is internal to the flash memory during a copyback operation, the Error Correction Code (ECC) cannot be evaluated before copying the source page to the destination page. As a result, any bit error (either caused by the copyback read operation or other error) cannot be detected and will be copied into the destination page, resulting in propagation and accumulation of the bit error.

SUMMARY

In order to address problems related to copyback programming, methods and systems are disclosed herein for detecting problems related to copyback programming.

According to a first aspect, a method of detecting errors in a copyback operation in a flash memory device is disclosed. The method includes, in the flash memory device with a controller, performing: internally copying data from a first non-volatile portion in a flash memory chip of the flash memory device to a volatile portion of the flash memory device; using a part of the data copied to the volatile portion to detect the presence of one or more errors; internally copying the data from the volatile portion to a second non-volatile portion of the flash memory chip; and modifying some or all of the data based on the detected presence of the one or more errors. In one embodiment, the copyback operation is performed on the flash memory chip, with copying from a first non-volatile portion on the flash memory chip to a volatile portion of the flash memory chip, and then copying from the volatile portion on the flash memory chip to a second portion on the flash memory chip. In another embodiment, part of the data copied to the volatile portion is copied external to the flash memory chip, such as to a volatile memory associated with the controller. In still another embodiment, depending on the detection of the one or more errors, the data associated with the copyback operation is modified, such as by verifying the data copied to the second portion of the flash memory chip and/or modifying the part of the data stored in the volatile portion prior to copying to the second portion of the flash memory chip. In yet another embodiment, depending on the detection of the one or more errors, a subsequent copyback operation is modified, such as disabling all subsequent copyback operations for the first non-volatile portion.

In another aspect, a storage device is disclosed. The storage device may comprise a flash memory device that is configured to detect errors in a copyback operation. The flash memory device comprises: a flash memory chip that includes a first non-volatile portion, a second non-volatile portion, and a volatile portion; and a controller in communication with the flash memory chip. The controller is configured to: command the flash memory chip to internally copy data from the first non-volatile portion to the volatile portion; use part of the data copied to the volatile portion to detect the presence of one or more errors; command the flash memory chip to internally copy the data from the volatile portion to the second non-volatile portion; and modify some or all the data associated with the copyback operation based on the detected presence of the one or more errors.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

As discussed in the background, copyback operations are "blind" in that the data is moved without being checked. In one embodiment, at least part of the data copied in the copyback process is checked during the copyback process. For example, after the copyback data is read into the internal flash buffer, a part of the copyback data stored in the internal flash buffer is analyzed to determine whether there are any errors in a part of the copyback data read.

One example of copyback data read into the internal flash is data in the source page. The data in the source page may include user data, metadata, and potentially spare data. Examples of metadata include logical block addresses (LBAs) of the user data and the relative age of the LBAs. Spare data includes one or more unused bytes in the source page.

In one aspect, part (or all) of the spare data stored in the internal flash buffer is analyzed to determine whether there is a problem in the copyback programming. To perform the analysis, part (or all) of the spare data may be moved external to the flash memory chip, such as from the internal flash buffer to a buffer within the controller of the flash memory, as discussed in more detail below. The controller may then analyze the spare data in order to determine whether there is a problem with the copyback programming.

The controller's analysis may include comparing an expected value of the spare data with the actual value of the spare data. In one embodiment, the expected value is a predetermined integrity check data value (such as 'FF00'), which may have been programmed previously into the source page prior to the start of the copyback operation. In another embodiment, the expected value is an initialization value that was programmed as part of an initialization. For example, prior to use of the source page, the source page is initialized with 'FF' values. In this way, the expected value of 'FF' need not be programmed in an operation separate from the initialization.

The comparison of the expected value with the actual value may indicate whether there is a problem with the copyback programming. For example, the analysis may indicate that one or more bytes of spare data include errors. The number of bytes that include errors may indicate that other data in the copyback programming, including the user data and the metadata, may have errors as well.

The controller's analysis may be used by the flash memory device in one or more ways related to the data associated with the current copyback operation, subsequent copyback operations, and subsequent treatment of the section in memory associated with the source page.

In one aspect, the controller's analysis may be used to modify or change the data associated with the current copyback operation, such as modify the data stored in the internal flash buffer or modify the data after it is stored back into non-volatile memory. For example, if the number of bytes in error is above a predetermined number, one or more bytes stored in the internal flash buffer (such as part (or all) of the spare data in the internal flash buffer) may be modified. As another example, the controller's analysis may be used to modify subsequent treatment of the data in the current copyback operation. For example, if the number of bytes in error is above a predetermined number, it may be determined that some (or all) of the data in the current copyback operations should be verified. So that, after copying of the data to the destination page in flash memory, the data may be verified by the controller using ECC.

In another aspect, the controller's analysis may be used to modify a subsequent copyback operation. For example, if the number of bytes in error is above a predetermined number, subsequent or future copyback operations for a particular part of the flash memory device (such as the block associated with the source page) may be prevented. Instead, updating of the pages in the block associated with the source page may be performed by copying to the buffer within the controller and by using the controller to perform ECC on the copied data.

In yet another aspect, the controller's analysis may be used to modify subsequent treatment of the section in flash memory associated with the source page. For example, if the number of bytes in error is above a predetermined number, it may be determined that part of the non-volatile memory (such as the block associated with the source page) may be reclaimed.

Figure 1:
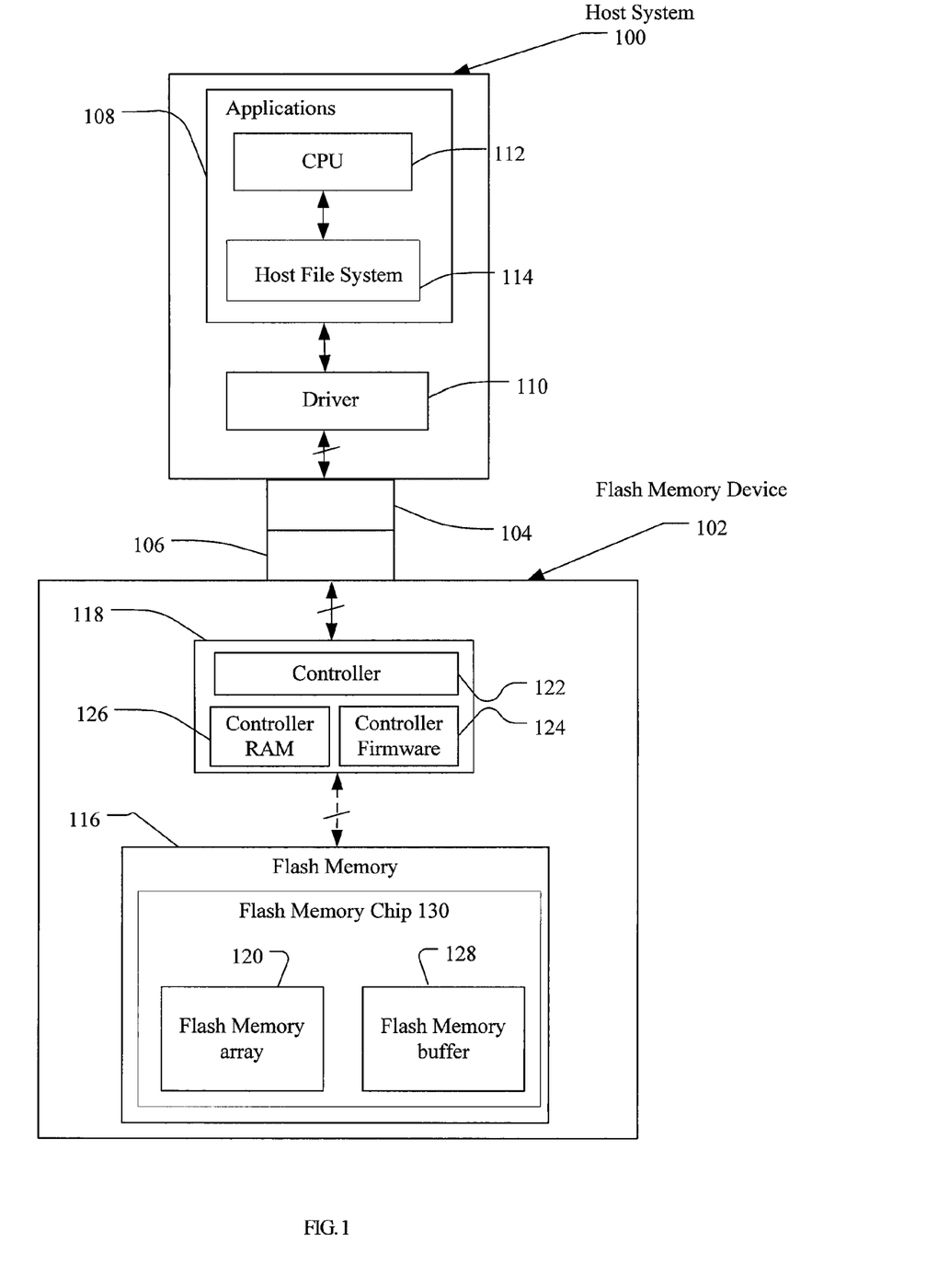
FIG. 1 illustrates a host connected with a flash memory device having a multi-bank non-volatile memory containing multiple die.

A flash memory device 102 suitable for use in implementing a copyback operation is shown in FIG. 1. A host system 100 of FIG. 1 stores data into and retrieves data from the flash memory device 102. The flash memory device 102 may be flash memory embedded within the host, such as in the form of a solid state disk (SSD) drive installed in a personal computer, a computer server, or a storage array. Alternatively, the flash memory device 102 may be in the form of a card that is removably connected to the host through mating parts 104 and 106 of a mechanical and electrical connector as illustrated in FIG. 1. A flash memory device configured for use as an internal or embedded SSD drive may look similar to the schematic of FIG. 1, with the primary difference being the location of the flash memory device 102 internal to the host. SSD drives may be in the form of discrete modules that are drop-in replacements for rotating magnetic disk drives.

The host system 100 of FIG. 1 may be viewed as having two major parts, insofar as the flash memory device 102 is concerned, made up of a combination of circuitry and software. They are an applications portion 108 and a driver portion 110 that interfaces with the flash memory device 102. In a PC, for example, the applications portion 108 can include a processor, such as CPU 112, running word processing, graphics, control or other popular application software, as well as the file system 114 for managing data on the host 100. In a camera, cellular telephone or other host system that is primarily dedicated to perform a single set of functions, the applications portion 108 includes the software that operates the camera to take and store pictures, the cellular telephone to make and receive calls, and the like.

The flash memory device 102 of FIG. 1 may include non-volatile memory, such as flash memory 116, and a system controller 118. The system controller 118 controls the flash memory 116 and communicates with the host 100 to which the flash memory device 102 is connected in order to pass data back and forth. The system controller 118 may convert between logical addresses of data used by the host 100 and physical addresses of the flash memory 116 during data programming and reading.

The flash memory 116 may include one or more flash memory chips 130. The flash memory chip 130 includes a flash memory array 120, which is a non-volatile memory, and a flash memory buffer 128, which is a volatile memory. FIG. 1 illustrates a single flash memory chip 130 with a single flash memory array 120 and a single flash memory buffer 128 by way of example. Further, the flash memory 116 may include multiple die, each containing an array of memory cells organized into multiple planes, and a volatile memory buffer. Alternatively, the memory cell array may not be divided into planes. In an alternate embodiment, the flash memory chips 130 include the flash memory array 120, and a separate chip may include the flash memory buffer 128.

Functionally, the system controller 118 may include a controller 122, which may comprises a processor, control logic, or the like. The system controller may also include controller firmware 124 for coordinating operation of the flash memory 116, such as monitoring copyback programming as disclosed below in FIGS. 2-4. The system controller 118 may further include controller RAM 126 (or other volatile memory associated with the controller 122). The system controller 118 may be implemented on a single integrated circuit chip, such as an application specific integrated circuit (ASIC), or may be also be incorporated into flash memory 116.

For example, the system controller 118 may initiate the copyback operation by sending a command to a particular flash memory chip in the flash memory 116 to move data from a source page of non-volatile memory into the flash memory buffer of the particular flash memory chip. This is discussed, for example, at 202 in FIGS. 2 and 402 in FIG. 4. The system controller 118 may further send a command (such as a direct memory access (DMA) command) to the particular flash memory chip in order to copy data stored in the flash memory buffer for storage in the controller RAM 126. In one embodiment, the command to copy data stored in the flash memory buffer for storage in the controller RAM 126 moves the data off-chip (from the particular flash memory chip to the controller chip). As discussed below, "spare" data is copied from the flash memory buffer into the controller RAM. This is discussed, for example, at 404 in FIG. 4. Moreover, the system controller 118 may command the particular flash chip to store data sent from the system controller into the flash memory buffer. This is discussed, for example, at 212 in FIG. 2 and 412 in FIG. 4. In addition, the system controller 118 may command the particular flash chip to store the data in the flash memory buffer into the destination page in the non-volatile flash memory array 120. This is discussed, for example, at 226 in FIG. 2.

The memory cells may be operated to store more than two detectable levels of charge in each charge storage element or region, thereby to store more than one bit of data in each. This configuration is referred to as multi level cell (MLC) memory. Alternatively, the memory cells may be operated to store two levels of charge so that a single bit of data is stored in each cell. This is typically referred to as a binary or single level cell (SLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

As discussed above, copyback operations are typically "blind" in that the data is moved without being checked. As a result, any bit error from the source page cannot be detected and will be copied into the destination page, resulting in propagation and accumulation of the bit error. Errors may be due, for example, to over-programming, which may cause bits in the memory cells to gain charge, and to retention loss, which may cause bits in the memory cells to lose charge. The charge in the cells of the flash memory may thus move due to the various errors, resulting in the bits to move as well, such as to the adjacent right or left state by over-programming or retention.

As discussed below, a part of the data (such as the spare data) stored in the flash buffer memory 128 is analyzed. The analysis of the spare data may be used to determine if the majority movement is towards charge gain or charge loss in a flash memory cell. For example, in a flash memory with a bit assignment, by upper page and lower page bit, of 11, 01, 00, and 10, over-programming may cause '1's to tend to '0' and retention loss may cause '0's to tend to '1's. For the analysis of the spare data to account for both over-programming and retention loss, the spare bits may be programmed with both '1's and '0's (such as FF). Alternatively, if the analysis is only focusing on one of the errors, then the spare bits may include only '1's, so that no preprogramming of a special sequence is necessary.

Figure 5:
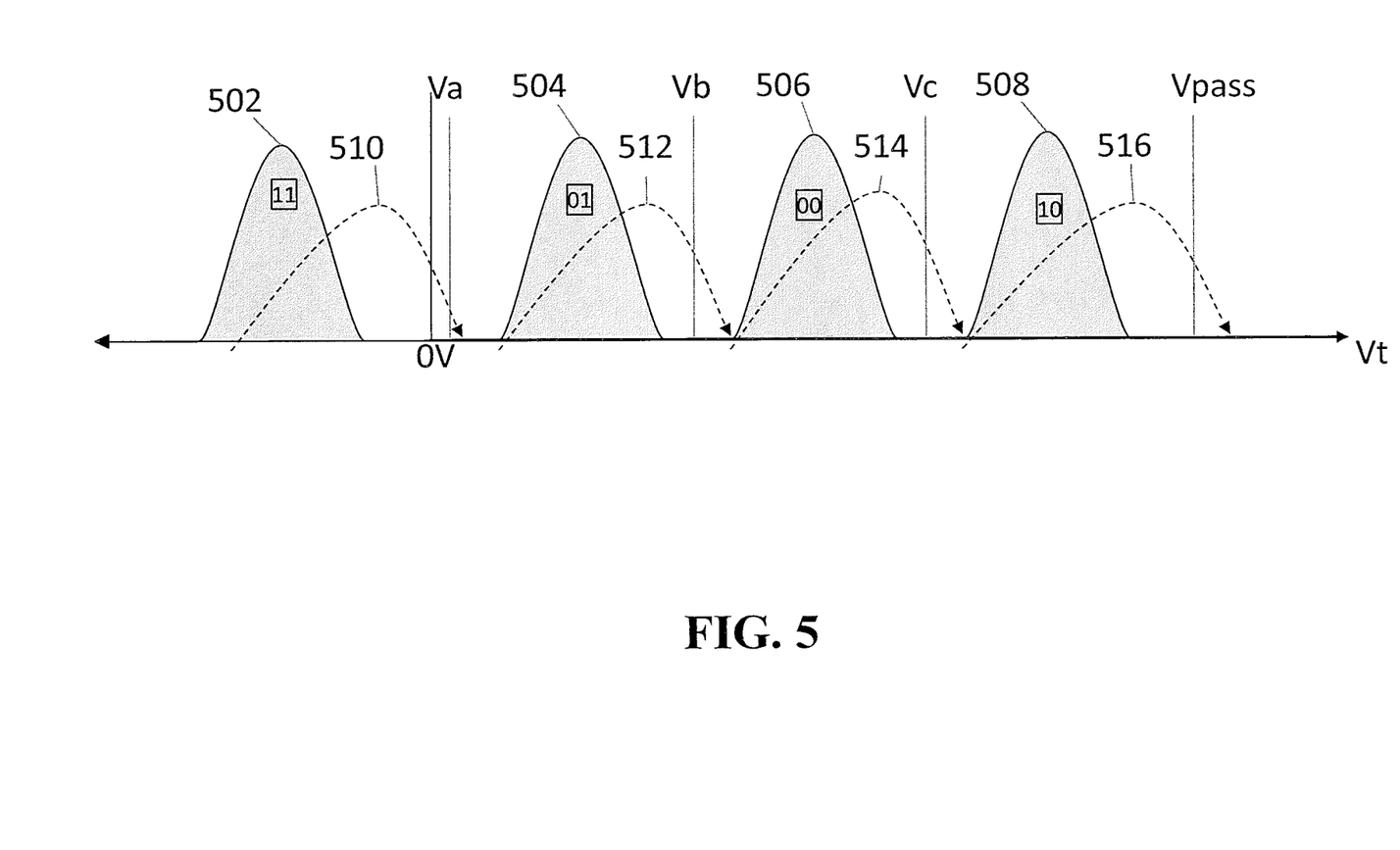
FIG. 5 illustrates charge levels in a MLC memory and migration of charge due to the effect of over-programming.

Referring to FIG. 5, there is shown the effect of errors due to over-programming on a specific type of MLC. In particular, FIG. 5 illustrates ideal charge levels 502, 504, 506, 508 for bits 11, 01, 00, 10, respectively. Further, there is shown curves 510, 512, 514, 516 which illustrate the potential charge levels due to effect of over-programming. The Va, Vb, and Vc are read reference voltages. Thus, FIG. 5 illustrates one example of the effect of over-programming on the values of the bits in 2-bit MLC flash memory. FIG. 5 is for illustration purposes. Other types of flash memory layouts may be affected differently by over-programming.

Figure 6:
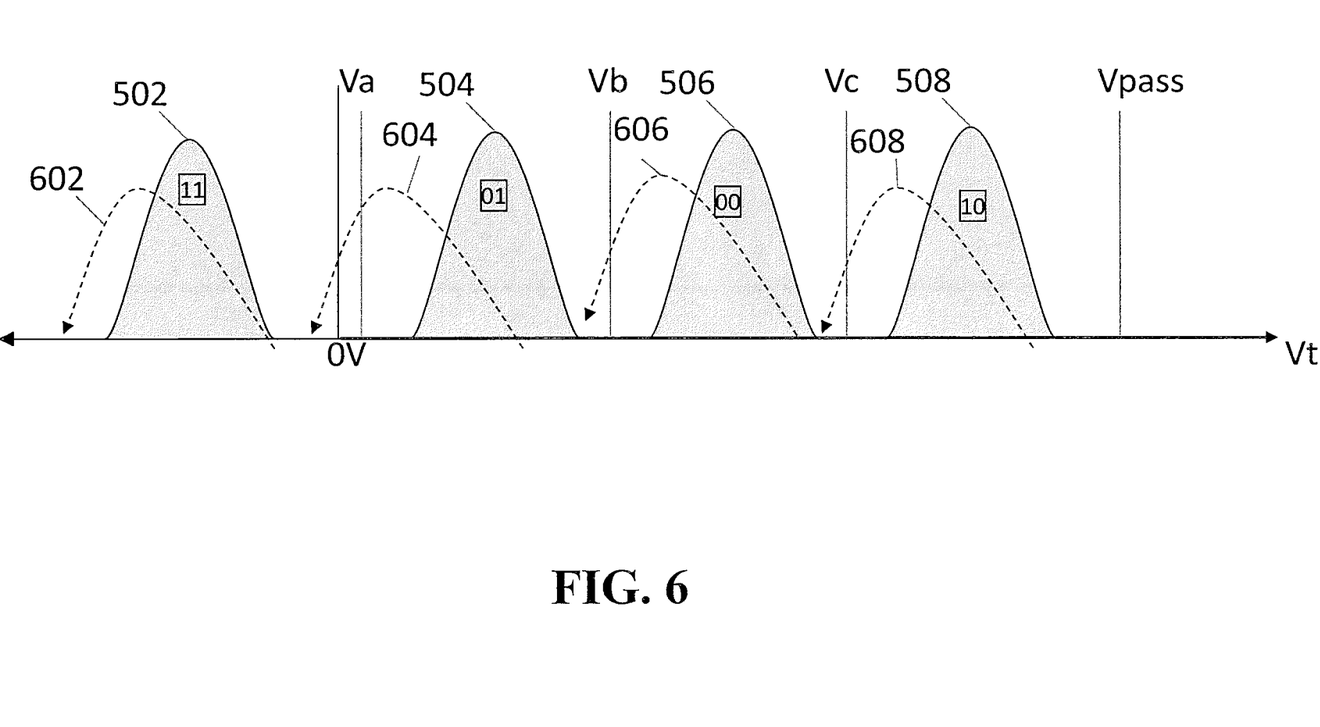
FIG. 6 illustrates charge levels in the MLC memory migration of charge due to the effect of retention loss.

Similar to FIG. 5, FIG. 6 illustrates ideal charge levels 502, 504, 506, 508 for bits 11, 01, 00, 10, respectively. Further, there is shown curves 602, 604, 606, 608 which illustrate the potential charge levels due to effect of retention loss. Thus, FIG. 6 illustrates one example of the effect of retention-loss on the values of the bits in 2-bit MLC flash memory. FIG. 6 is for illustration purposes. Other types of flash memory layouts may be affected differently by retention loss.

Figure 2:
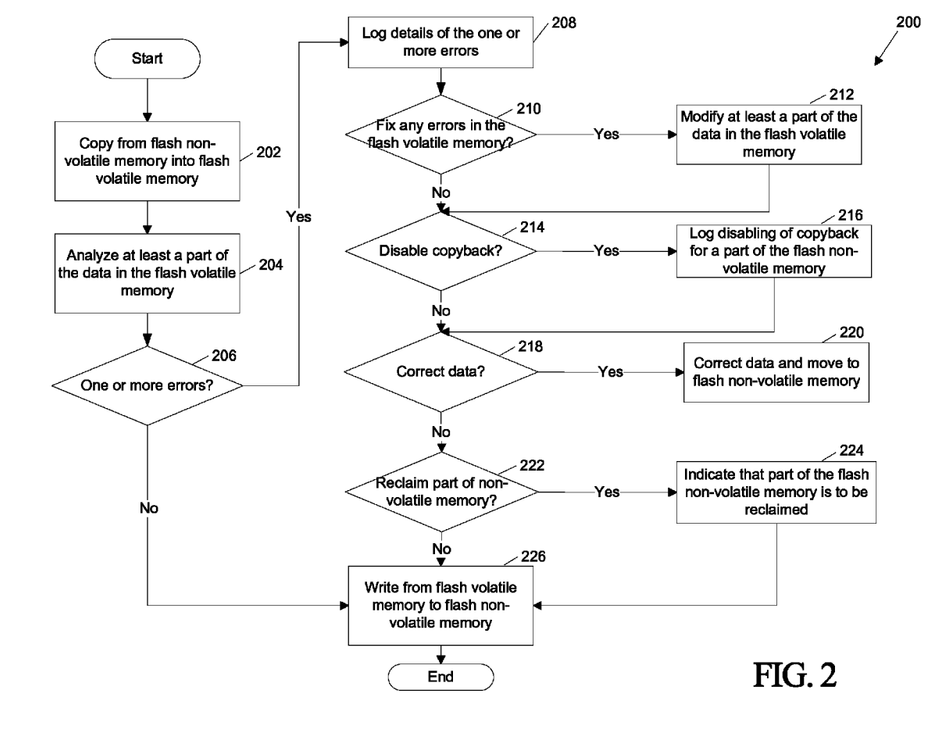
FIG. 2 is a flow chart of one method for analyzing data during a copyback operation and potential applications of the analysis.

FIG. 2 is a flow chart 200 of one method for analyzing data during a copyback operation and potential applications of the analysis. At 202, data (such as a source page) is copied from flash non-volatile memory (such as flash memory array 120) to flash volatile memory (such as flash memory buffer 128). At 204, the controller 122 analyzes at least a part of the data in the flash volatile memory. As discussed above, the spare data copied into the flash memory buffer 128 is analyzed. At 206, the controller 122 determines whether the analysis finds one or more errors. If not, at 226, the data in the flash volatile memory is written to the flash non-volatile memory. If so, at 208, the controller 122 logs the details of the one or more errors, such as the bits in the spare data that were in error. At 210, the controller 122 determines whether to fix errors in the data in the flash volatile memory. If so, at 212, at least a part of the data in the flash volatile memory is modified. As discussed above, the data in the flash volatile memory may include user data, metadata, and spare data. In one aspect, part (or all) of the spare data is modified.

At 214, the controller 122 determines whether to disable subsequent copyback operations. If so, at 216, the controller 122 logs disabling of subsequent copyback operations for a part of the flash non-volatile memory, such as for the source page or for the entire block associated with the source page. At 218, the controller 122 determines whether to correct the data in the copyback operation. If so, at 220, the data is corrected and moved to flash non-volatile memory.

At 222, the controller 122 determines whether to reclaim part of the non-volatile memory. If the analysis indicates serious errors in the copyback data (such as numerous errors in the spare data stored in the flash volatile memory), the controller 122 may determine that a section of memory should be reclaimed and no longer used. If so, at 224, a part of the flash non-volatile memory (such as the block associated with the source page) is indicated to be reclaimed. At 226, the data in the flash volatile memory is written to the flash non-volatile memory.

Figure 3:
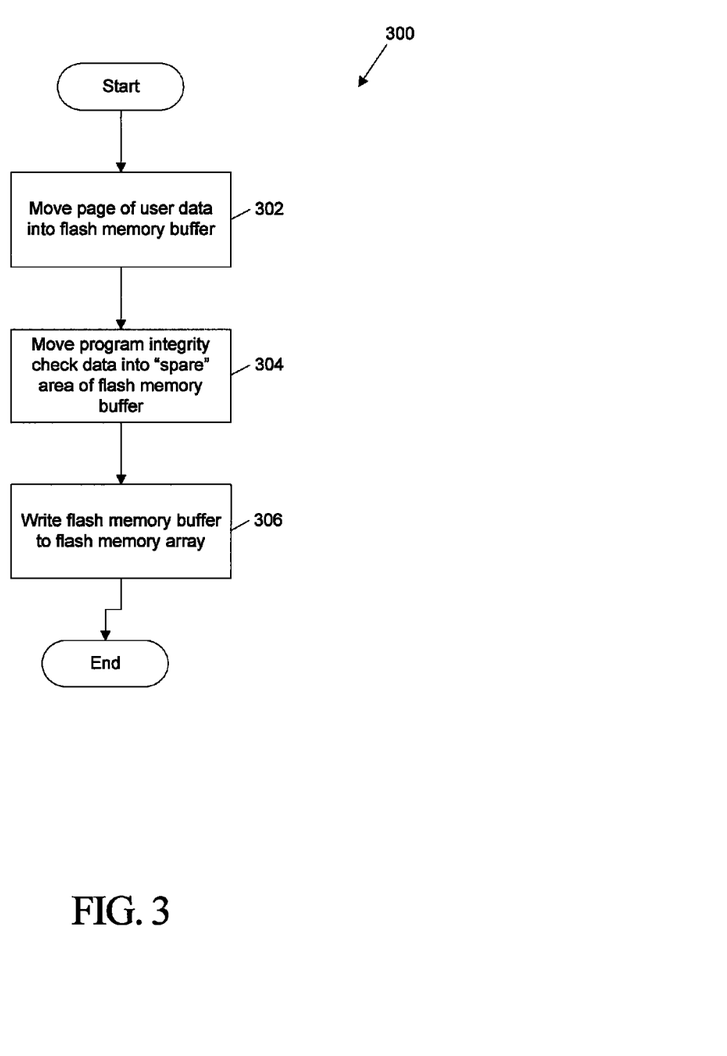
FIG. 3 is a flow chart of a method to program the spare area of the flash array with program integrity check data.

FIG. 3 is a flow chart 300 of a method to program the spare area of the flash array with program integrity check data. As discussed above, in certain instances, the flash non-volatile memory may be programmed with a special code for later checking during the copyback process. At 302, a page of user data is moved into the flash memory buffer (such as flash memory buffer 128). At 304, program integrity check data is moved into "spare" area of the flash memory buffer. As discussed above, the spare area of memory may include the space in the flash memory buffer that is not used even with a full page of data loaded into the flash memory buffer. At 306, the contents of the flash memory buffer are written to the flash memory array.

Figure 4:
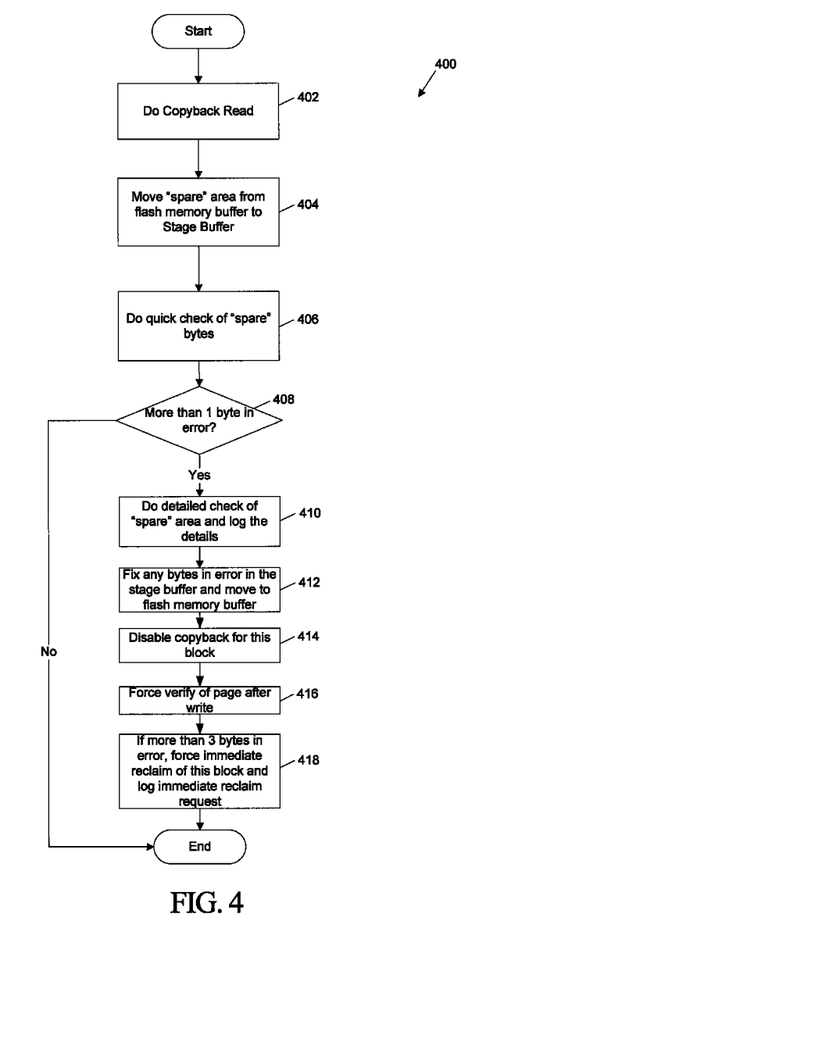
FIG. 4 is a flow chart of another method for analyzing data during a copyback operation and potential applications of the analysis.

FIG. 4 is a flow chart 400 of another method for analyzing data during a copyback operation and potential applications of the analysis. At 402, a copyback read is performed. At 404, the "spare" area is moved from the flash memory buffer into the stage buffer (which may be controller RAM 126). At 406, the controller 122 may perform a quick check of the "spare" bytes. At 408, the controller 122 may determine whether the "spare" bytes include more than 1 byte in error. If so, at 410, the controller 122 may perform a detailed check of the "spare" area and log the details. Optionally, at 412, the controller 122 may fix any bytes in error in the stage buffer and move the bytes into the flash memory buffer. For example, the controller 122 may input the correct predetermined code (such as the program integrity check data) into the stage buffer, which in turn is sent to the flash memory buffer, and ultimately programmed into the flash memory array. In this way, the errors in the "spare" area need not be propagated.

Optionally, at 414, copyback is disabled for the block associated with the source page. The determination whether to disable copyback for the block associated with the source page may be based on a first predetermined number of "spare" bytes that are in error (as shown in FIG. 4, the first predetermined number of "spare" bytes that are in error is greater than 1). Optionally, at 416, the controller 122 may force verification of the page after the write to the flash memory array. The determination whether to disable copyback for the block associated with the source page may be based on a second predetermined number of "spare" bytes that are in error (as shown in FIG. 4, the second predetermined number of "spare" bytes that are in error is greater than 1). In one embodiment, the first predetermined number of error bytes may be the same as the second predetermined number of error bytes (such as shown in FIG. 4) or may be different. Further, at 418, if more than a third predetermined number of bytes are in error (3, as shown in FIG. 4), the controller 122 forces immediate reclaim of the block associated with the source page, and logs an immediate reclaim request. If the errors are considered severe enough, the controller 122 may determine that the block associated with the source page is unreliable enough that it should not be used further, leading to the block being retired from further use. FIG. 4, including the various steps and the number of error bytes, are merely for illustration purposes. Other steps, and other numbers of error bytes, may be used.

It is intended that the foregoing detailed description be understood as an illustration of selected forms that the invention can take and not as a definition of the invention. It is only the following claims, including all equivalents, which are intended to define the scope of this invention. Also, some of the following claims may state that a component is operative to perform a certain function or configured for a certain task. It should be noted that these are not restrictive limitations. It should also be noted that the acts recited in the claims can be performed in any order and not necessarily in the order in which they are recited.

What is claimed is:

1. A method of detecting errors in a copyback operation in a flash memory device, the method comprising:
   in the flash memory device with a controller, prior to a copyback operation, programming a page of data such that a subset of the page of data includes a predetermined sequence of bits;
   performing the copyback operation by:
      internally copying the page of data from a first non-volatile portion in a flash memory chip of the flash memory device to a volatile portion of the flash memory device;
      copying the subset of the page of data from the volatile portion of the flash memory device to memory associated with the controller;
      detecting the presence of one or more errors by analyzing the data subset copied to the memory associated with the controller, wherein analyzing the data subset includes determining whether the data subset includes the predetermined sequence of bits; and
      in accordance with detecting the presence of the one or more errors in the data subset:
         verifying all of the data copied to the volatile portion, the verifying including correcting detected errors; and
         storing the verified data to a second non-volatile portion of the flash memory chip.

2. The method of claim 1, wherein the first non-volatile portion, the second non-volatile portion and the volatile portion of the flash memory device are included in the flash memory chip of the flash memory device, and the controller and the memory associated with the controller are included in a system controller chip that is separate from the flash memory chip in the flash memory device.

3. The method of claim 1, wherein the detecting includes detecting a quantity of errors, the method further comprising in accordance with a determination that the quantity of errors exceeds a predetermined threshold, preventing copyback operations, subsequent to the copyback operation, for the first non-volatile portion of the flash memory chip.

4. The method of claim 1, wherein verifying all of the data copied to the volatile portion further comprises correcting the one or more errors detected.

5. The method of claim 1, wherein the detecting includes detecting a quantity of errors, the method further comprising, in accordance with a determination that the quantity of errors exceeds a predetermined threshold, determining whether to reclaim the first non-volatile portion of the flash memory chip.

6. The method of claim 1, wherein the first non-volatile portion of the flash memory chip comprises a block of the flash memory chip, and the data copied from the first non-volatile portion in the flash memory chip of the flash memory device is copied from the block of the flash memory chip and comprises a page of data.

7. A flash memory device configured to detect errors in a copyback operation, the flash memory device comprising:
   a flash memory chip comprising a first non-volatile portion, a second non-volatile portion, and a volatile portion; and
   a controller in communication with the flash memory chip, the controller configured to:
      program a page of data such that a subset of the page of data includes a predetermined sequence of bits;
      command the flash memory chip to internally copy the page of data from the first non-volatile portion to the volatile portion of the flash memory device;
      copy the subset of the page of data from the volatile portion of the flash memory device to memory associated with the controller;

detect the presence of one or more errors by analyzing the data subset copied to the memory associated with the controller, wherein analyzing the data subset includes determining whether the data subset includes the predetermined sequence of bits; and command the flash memory chip to in accordance with detecting the presence of the one or more errors in the data subset:

verify all of the data copied to the volatile portion, the verifying including correcting detected errors; and storing the verified data to a second non-volatile portion of the flash memory chip.

8. The flash memory device of claim 7, wherein the first non-volatile portion, the second non-volatile portion and the volatile portion of the flash memory device are included in the flash memory chip of the flash memory device, and the controller and the memory associated with the controller are included in a system controller chip that is separate from the flash memory chip in the flash memory device.

9. The flash memory device of claim 7, wherein the controller is configured to detect a quantity of errors in the subset of the data, and the controller is further configured to in accordance with a determination that the quantity of errors exceeds a predetermined threshold, prevent copyback operations, subsequent to the copyback operation, for the first non-volatile portion of the flash memory chip.

10. The flash memory device of claim 7, wherein the controller is configured to verify all of the data copied to the volatile portion by at least correcting the one or more errors detected.

11. The flash memory device of claim 7, wherein the controller is configured to detect a quantity of errors, and the controller is further configured to in accordance with a determination that the quantity of errors exceeds a predetermined threshold, determine whether to reclaim the first non-volatile portion of the flash memory chip.

12. The flash memory device of claim 7, wherein the first non-volatile portion of the flash memory chip comprises a block of the flash memory chip, and the data copied from the first non-volatile portion in the flash memory chip of the flash memory device is copied from the block of the flash memory chip and comprises a page of data.

* * * * *